United States Patent

[11] 3,633,052

[72] Inventor John E. Hanna
San Jose, Calif.

[21] Appl. No. 36,964
[22] Filed May 13, 1970
[45] Patented Jan. 4, 1972
[73] Assignee National Semiconductor Corporation
Santa Clara, Calif.

[54] LOW-NOISE INTEGRATED CIRCUIT ZENER VOLTAGE REFERENCE DEVICE INCLUDING A MULTIPLE COLLECTOR LATERAL TRANSISTOR
7 Claims, 4 Drawing Figs.

[52] U.S. Cl. .......................................................... 307/299, 317/235 R, 317/235 Y, 317/235 Z, 317/235 T, 307/241, 307/285, 307/303
[51] Int. Cl. .......................................................... H01l 19/00
[50] Field of Search ............................................ 317/235 (40.12), 235 (40.13), 235 (30), 237; 307/241, 285, 299 A, 302, 303, 296, 297; 323/22 T, 22 Z

[56] References Cited

UNITED STATES PATENTS

| | | | |
|---|---|---|---|
| 3,524,998 | 8/1970 | Gilbert ........................ | 307/299 |
| 3,579,059 | 5/1971 | Widlar ........................ | 317/235 |
| 3,523,198 | 8/1970 | Keller ........................ | 307/297 |
| 3,303,413 | 2/1967 | Warner et al. ............... | 323/4 |
| 3,345,518 | 10/1967 | Thompson .................... | 307/299 |

*Primary Examiner*—John W. Huckert
*Assistant Examiner*—B. Estrin
*Attorney*—Harvey G. Lowhurst

ABSTRACT: A low-noise integrated circuit zener voltage reference device including a multiple collector lateral transistor and a zener breakdown device coupled together in such a manner as to utilize the relatively poor-high frequency response characteristics and the plural current paths of the lateral transistor to substantially reduce the level of broadband zener noise appearing in the reference voltage.

INVENTOR
JOHN E. HANNA
BY [signature]
ATTORNEY

LOW-NOISE INTEGRATED CIRCUIT ZENER VOLTAGE REFERENCE DEVICE INCLUDING A MULTIPLE COLLECTOR LATERAL TRANSISTOR

BACKGROUND OF THE INVENTION

1. Field of the Invention

The present invention relates generally to integrated circuit apparatus and, more particularly, to a novel integrated circuit zener voltage reference device having low noise characteristics.

2. Discussion of the Prior Art

Zener diodes are typically used as voltage reference sources in low input level, high-frequency circuits, i.e., those in which the available signal is approximately 100 microvolts, or less, and of a frequency exceeding 100 kilohertz. However, since the zener diode itself generates a considerable amount of broadband noise, the usual practice is to connect a capacitance in shunt across the reference so that the high-frequency noise energy is absorbed in the capacitance. Although a capacitor can be built into the integrated circuit, this requires the consumption of considerable chip area. For example, to include an IC capacitor of approximately 100 picofarads in a typical integrated circuit may require as much as one-half the area of the complete circuit.

The other alternative is to use an external capacitor, but to do so an extra connecting pin must be provided in the circuit encapsulation assembly. Such pin provision is, however, quite expensive since most IC circuits are invariably pin limited. In other words, to require that one of the external leads, or pins, in a given integrated circuit package be reserved for an external bypassing capacitor would prohibit that pin from being used in a more advantageous fashion for some other circuit connection. Therefore, a tradeoff is generally made between circuit area and pin utilization with the more likely practice being to use an external capacitor coupled between a reference pin and circuit ground.

OBJECTS OF THE INVENTION

It is therefore a primary object of the present invention to provide a low-noise, voltage reference circuit means for use in an integrated circuit which does not require the use of a capacitor.

Another object of the present invention is to provide a low-noise, integrated circuit zener diode reference means which does not require the use of a capacitor to absorb the zener noise.

Still another object of the present invention is to provide a low-noise, voltage reference circuit for use in integrated circuit apparatus which utilizes a zener diode along with circuit means for noncapacitively limiting the noise generated by the zener diode.

Still another object of the present invention is to provide a low-noise integrated circuit reference for use in high-frequency circuits which includes a single transistor and a single zener diode in the same structure.

SUMMARY OF THE INVENTION

In accordance with the present invention, a low-noise, integrated circuit zener voltage reference is provided which includes a multiple collector lateral transistor and a zener diode coupled together in such a manner as to utilize the relatively poor high-frequency response characteristics, and the plural collector current paths, of the lateral transistor to substantially reduce the level of zener noise appearing in the reference voltage. More particularly, the base and a first collector of a dual collector transistor are coupled to circuit ground through a zener breakdown device while the second collector is coupled directly to ground. The reference voltage is then taken at the emitter of the transistor. In a preferred integrated circuit embodiment utilizing a dual collector lateral transistor structure, the first collector region is made smaller than the second collector region by a predetermined amount so that only a predetermined fraction of the emitter current is allowed to flow through the zener diode while the larger proportion is caused to flow directly to ground.

Accordingly, a substantial reduction in the high-frequency zener noise that would otherwise be introduced into the reference is achieved without the use of any capacitive elements, either internal or external of the circuit, this being accomplished as a result of the small percentage of the total collector current allowed to flow through the zener, coupled with the inherent frequency response characteristics of the multiple collector lateral PNP-transistor.

An important advantage of the present invention is that a good high-frequency voltage reference may be provided in an integrated circuit which requires no capacitive elements and no more surface area than the average transistor element.

Other advantages of the present invention will become apparent to those skilled in the art after having read the following detailed description of the preferred embodiments which are described below with reference to the several figures of the drawing.

IN THE DRAWING

DETAILED DESCRIPTION OF THE PREFERRED EMBODIMENTS

Figure 1:
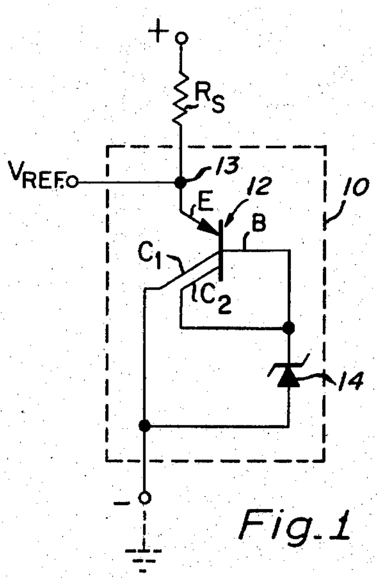
FIG. 1 is a schematic diagram of a circuit illustrating voltage reference apparatus in accordance with the present invention.

Referring now to FIG. 1 of the drawing, there is shown a schematic diagram of a voltage reference circuit 10 including a multiple collector lateral PNP-transistor 12 and a zener diode 14. As will be described in more detail with reference to FIG. 2, a lateral PNP-circuit is chosen for purposes of illustration since most modern integrated circuits utilize double-diffused active circuit elements of the NPN-type and as a consequence lateral PNP-devices can be integrated without the need for additional processing steps. It is to be understood, however, that the elements 12 and 14 could just as well be of the opposite conductivity type where used in an appropriate circuit.

The emitter E of transistor 12 is connected through a load impedance such as the resistor $R_x$ to a positive source of potential and the reference voltage $V_{ref}$ is taken at point 13, i.e., at the emitter of transistor 12. One of the collectors $C_1$ of transistor 12 is connected directly to a negative potential source, or circuit ground, and the other collector $C_2$ is connected directly to the base B. The cathode of zener diode 14 is connected to the shorting connection between the base B and collector $C_2$, and the anode of zener diode 14 is connected to circuit ground. By appropriate transistor design, the collector $C_2$ is made capable of receiving only a small fraction of the total collector current with the collector $C_1$ receiving the remainder.

A preferred method of providing the multiple collector transistor 12 is disclosed in the copending U.S. Pat. application by Robert J. Widlar, Ser. No. 712,040, filed Mar. 11, 1968 and assigned to the assignee of the present invention, now U.S. Pat. No. 3,579,059. As disclosed in the Widlar patent, the collector geometry of the transistor 12 may be chosen such that a substantially larger portion of the collector current will flow through one of the collectors $C_1$ than through the other collector $C_2$. This is accomplished by providing transistor 12 with two separate collectors, each of which is essentially independent of the other. With each collector equally spaced from the emitter, the proportion of the total collector current drawn by each of the collectors is determined by the effective PN-junction length of each collector. The effective junction length of each collector is essentially the length of that portion of the PN-junction most nearly adjacent to the emitter-base PN-junction. Thus, by selecting the geometry of the respective collector regions so as to provide effective junction lengths having a particular relationship, the percentage of the total collector current drawn by each collector can be predetermined at the time of manufacture. As an example, one might choose a 4-to-1 ratio between the respective junction lengths so that the current in one collector will be four times the current in the other collector.

Figure 2:
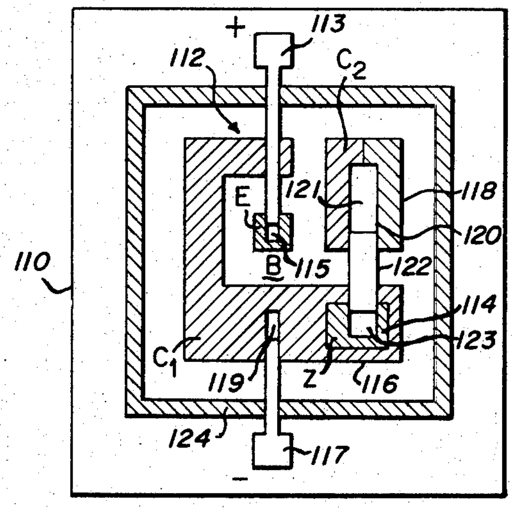
FIG. 2 is a plan view of an actual embodiment of an integrated circuit of the type illustrated in FIG. 1.

An exemplary embodiment of the present invention is shown in FIG. 2 which is an IC application of the circuit 10 shown in FIG. 1. In this embodiment, the wafer 110 is of N-type material having diffused thereinto a multiple collector transistor 112 comprised of a P-type emitter region E, a P-type collector region $C_1$ and a P-type collector region $C_2$. The zener diode Z is provided by diffusing an N-type region 114 into an extension 116 of the collector region $C_1$. An N+ region 118 forms a highly concentrated region in the wafer 110 so that a good ohmic contact can be made to the base B at 120 by the interconnect 122. The metallic interconnect 122 also ohmically contacts the collector region $C_2$ at 121 and the zener region 114 at 123.

Electrical contact to the emitter E is provided by the interconnect 113 which ohmically contacts emitter E at 115. Likewise, electrical contact to the collector $C_1$ is provided by the interconnect 117 which ohmically contacts collector $C_1$ at 119. Although not shown in the drawing, it should be noted that the interconnects 113, 117 and 122 are insulated from the wafer 110 at all points except the contact areas 115, 119, 121 and !23, by an oxide layer covering the surface of the wafer. An isolation ring 124 of P+ material is provided in the wafer 110 around the collectors $C_1$ and $C_2$ for reasons well known in the art.

Now referring back to FIG. 1 for explanation of the operative characteristics of the circuit, the DC voltage reference $V_{ref}$ available at point 13 can be expressed as $$1.\quad V_{ref}=V_{BE}(I_E)+V_Z+I_ZR_Z$$

where $V_{BE}$ is a function of the emitter current $I_E$, and $V_Z+I_ZR_Z$ is the total zener voltage of the circuit.

Equation (1) can further be reduced to (2)

$$V_{ref}=\frac{kT}{q}\ln\frac{I_E}{I_S}+V_Z(N_A{}^P,\ N_D{}^N)+\left(\frac{I_E}{K_c}+I_B\right)R_Z$$
$$=\frac{kT}{q}\ln\frac{I_E}{I_S}+V_Z(N_A{}^P,\ N_D{}^N)+I_E\left(\frac{1}{K_c}+\frac{1}{\beta-1}\right)R_Z$$

where $k$ is Boltzmann's constant, $q$ is the electronic charge, $T$ is the temperature, $I_E$ is the emitter current, $I_S$ is the current through $R_s$, $N_A{}^P$ is the number of acceptors, $N_D{}^N$ is the number of donors, $K_c$ is the collector ratio between collector $C_1$ and $C_2$, $\beta$ is the current gain of transistor 12, and $R_Z$ is the resistance of zener diode 14.

The noise power in terms of $e^2_{\eta ref}$ of the circuit may be expressed as $$3.\quad e^2_{\eta ref}=e^2_{\eta Z}(I_E/K_c)+e^2_{\eta PNP}$$

where the first term is the zener noise power and the second term is the noise power introduced by transistor 12. This relationship can also be written as $$4.\quad i_\eta{}^2{}_{ref}=Fi_\eta{}^2{}_Z\left(\frac{I_E}{K_c}\right)+i_\eta{}^2{}_{pnp}$$

where $F$ is a constant less than or equal to one, $i_{\eta Z}\left(\frac{I_E}{K_c}\right)$ is the noise current in the zener operating at the current $(I_E/K_c)$ and $i_{\eta pnp}$ is the noise current introduced by the PNP-transistor 12. The PNP-noise, however, is negligible and may be eliminated from consideration.

Using these relationships the noise power $e\eta^2{}_{ref}$ appearing at terminal 13 can be expressed as $$5.\quad e_\eta{}^2{}_{ref}=i_\eta{}^2{}_{ref}R_s{}^2$$

where $R_s$ is the resistance across which the reference is taken.

As pointed out above, the ratio $K_c$ between the collectors $C_1$ and $C_2$ is, for purposes of illustration, chosen as being 4–1 and since the zener current makes up only one-fourth of the current flowing passed terminal 13, the zener noise power in terms of $i_\eta Z^2$ may be expressed as:

$$(6)\quad i_\eta{}^2{}_{ref}=\frac{i_\eta{}^2{}_Z}{4G}$$

where $G$ is a constant proportional to the change in zener noise at different DC currents. Therefore, the noise power in terms of zener voltage can be expressed as $$(7)\quad e_\eta{}^2{}_{ref}=\frac{e_\eta{}^2{}_Z}{4G}$$

Figure 3:
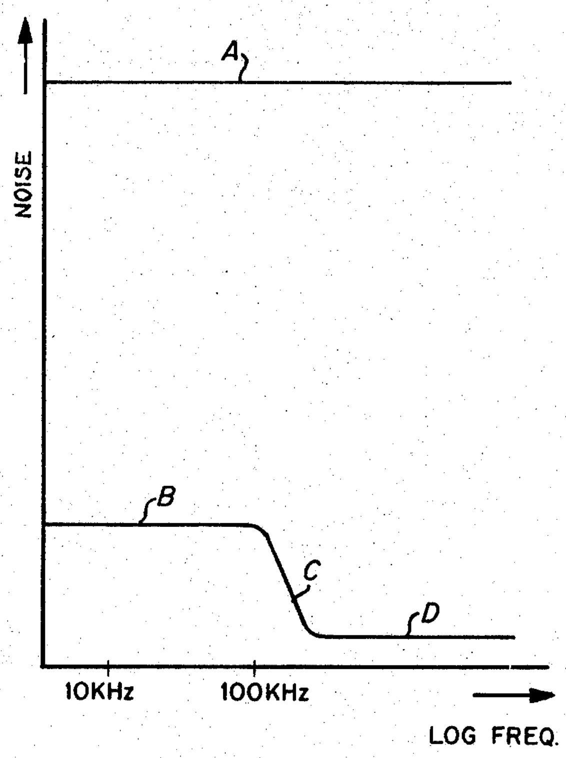
FIG. 3 is a noise versus frequency diagram illustrating the reduction in noise achieved using a voltage reference in accordance with the present invention.

Accordingly, the noise at reference terminal 13 of frequencies less than 100 kilohertz, i.e., the range of frequencies for which the transistor 12 is responsive, will be reduced to one-fourth of the noise current introduced by a prior art zener reference circuit operating at the same current level without a bypass capacitor. This is illustrated in FIG. 3 of the drawing by the curves A and B respectively, where A represents the broadband noise of a zener operating at X milliamps and B represents the noise appearing at reference terminal 13 of the present invention for a like reference current. Note, however, that the current through the zener is reduced to $X/4$ milliamps so that the zener noise is reduced by approximately 75 percent at frequencies below 100 kilohertz. As the operational frequencies at the reference terminal 13 exceed 100 kilohertz, the response of the transistor 12 falls off as indicated at C so that the zener noise is substantially reduced even further, as shown at D.

Figure 4:
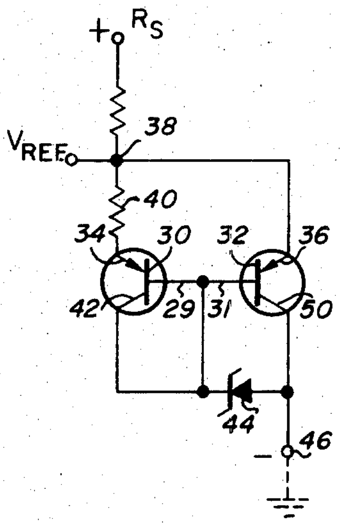
FIG. 4 is an alternative embodiment of a voltage reference circuit in accordance with the present invention utilizing single collector PNP devices.

Referring now to FIG. 4 of the drawing, an alternate embodiment of the present invention utilizing ordinary bipolar transistors is shown. In this embodiment, the base 29 of a first transistor 30, and the base 31 of a second transistor 32, are directly coupled together, while the respective emitters 34 and 36 are commonly coupled to the reference terminal 38. Note that a biasing resistance 40 is provided in the emitter circuit of transistor 30 for reducing the collector current of transistor 30 to a predetermined fraction of that of transistor 32. As an alternative, the geometries of transistors 30 and 32 may be ratioed in size. The collector 42 of transistor 30 is coupled through the zener diode 44 to the negative, or ground terminal, 46 as well as being shorted directly to its base and the base 31 of transistor 32 by the lead 48. The collector 50 of transistor 32 is coupled directly to the ground terminal 46.

In a manner similar to the previously described circuit of FIG. 1, the reference current at terminal 38 splits and flows through the transistors 30 and 32 at a ratio determined by the resistance 40 and/or by the relative geometries of the transistors. Thus, by making an appropriate selection of the resistance 40 and/or the geometries of the transistors 30 and 32, the current allowed to flow through the zener 44 can be made a predetermined proportion of the total reference current at point 38. This circuit will behave similarly to that illustrated in FIG. 1, but will require substantially greater wafer surface area to accommodate the respective transistors 30 and 32 which must be isolated from each other as well as the resistance 40. However, as in the previous embodiment, no capacitive circuit elements are required.

In either of the above examples, current flowing from the positive terminal through the reference network to the negative terminal will be divided into two principal paths and since the ratios of these currents have been chosen such that the current flowing through the zener is a selected fraction of the total reference current, it will be noted that the noise introduced into the reference voltage at frequencies below 100 kilohertz by the zener diode will be approximately equal to the noise of a zener operating at that same fraction of the current appearing at the reference terminal. This alone is a substantial improvement over that obtainable using a simple zener reference, but the fact that the frequency response of the PNP-transistor drops off at frequencies above 100 kilohertz causes the noise level at these higher frequencies to be reduced substantially more. A further incidental advantage obtained in the present invention is that since the emitter-to-base PN-junction is of opposite polarity to the zener diode PN-junction, the circuit will inherently provide temperature compensation.

Although a 4–1 ratio has been chosen for purposes of explanation, it will be readily apparent to those skilled in the art that the noise power at the reference terminal can be reduced to any desired level by merely choosing a different collector current ratio. This ratio would, in the preferred embodiment of FIG. 1, be determined by the relative sizes of the collector regions such as illustrated in FIG. 2. The primary restriction is that the current flowing through the zener diode must be sufficient to cause it to completely break down, i.e., approximately 10 microamps in state of the art devices. Such a circuit has utility in any high-frequency response amplifier or any other device in which the high-frequency characteristics would be degraded by the broadband noise of the normal zener diode.

It is contemplated that after having read the above description of the preferred embodiments those skilled in the art may foresee certain alterations and modifications which have not been pointed out with particularity herein. Accordingly, this disclosure is intended as being in the nature of an explanatory illustration only and is in no way to be considered as limiting. Therefore, the appended claims are to be interpreted as covering all modifications which fall within the true spirit and scope of the invention.

What is claimed is:

1. A voltage reference circuit, comprising:

means forming a first terminal for connection to a first source of potential;

means forming a second terminal for connection to a second source of potential;

means forming a reference terminal at which a reference voltage may be obtained;

a load impedance coupling said first terminal to said reference terminal;

transistor means including a base, an emitter coupled to said reference terminal, a first collector coupled to said second terminal and a second collector coupled to said base; and a reverse biased zener diode coupling said second collector to said second terminal.

2. A voltage reference circuit as recited in claim 1 wherein said base includes a first body of semiconductive material of a first conductivity type, said emitter includes a second body of semiconductive material of a second conductivity type forming a first PN-junction junction with said first body, said first collector includes a third body of semiconductive material of said second conductivity type forming a second PN-junction with said first body, and said second collector includes a fourth body of semiconductive material of said second conductivity type forming a third PN-junction with said first body.

3. A voltage reference circuit as recited in claim 2 wherein said zener diode includes a fifth body of semiconductive material of said first conductivity type forming a fourth PN-junction with said third body.

4. A voltage reference circuit as recited in claim 2 wherein the ratio of the effective junction length of said second PN-junction to the effective junction length of said third PN-junction is such that the current flowing through said second collector is less than the current flowing through said first collector.

5. A voltage reference circuit, comprising:

means forming a first terminal;

means forming a second terminal;

a lateral transistor including an emitter region of a first conductivity type coupled to said first terminal, a base region of a second conductivity type disposed in PN-junction forming relationship with said emitter region, a first collector region of said first conductivity type disposed in PN-junction forming relationship with said base region and coupled to said second terminal, a second collector region of said second conductivity type disposed in PN-junction forming relationship with said base region; and means forming a reversed biased zener diode coupling said second collector region to second terminal.

6. A voltage reference circuit as recited in claim 5 wherein said means forming said zener diode includes a body of semiconductive material of said second conductivity type disposed in PN-junction forming relationship with said first collector region.

7. A voltage reference circuit as recited in claim 5 wherein the effective junction length of the PN-junction formed between said base region and said first collector region is larger than the effective junction length of the PN-junction formed between said base region and said second collector, whereby less than one-half of the total collector current of said transistor flows through said zener diode.

* * * * *